(12) United States Patent
Irino

(10) Patent No.: US 7,005,393 B2
(45) Date of Patent: *Feb. 28, 2006

(54) METHOD OF FABRICATING A SEMICONDUCTOR DEVICE CONTAINING NITROGEN IN AN OXIDE FILM

(75) Inventor: Kiyoshi Irino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/170,688

(22) Filed: Jun. 14, 2002

(65) Prior Publication Data

US 2002/0151099 A1   Oct. 17, 2002

Related U.S. Application Data

(62) Division of application No. 09/428,052, filed on Oct. 27, 1999, which is a division of application No. 08/917,936, filed on Aug. 27, 1997, now Pat. No. 5,990,517.

(30) Foreign Application Priority Data

Mar. 6, 1997   (JP)   .................. 9-052085

(51) Int. Cl.
   *H01L 21/31*   (2006.01)
(52) U.S. Cl. ............ 438/787; 438/216; 438/287; 438/769; 438/775; 438/786
(58) Field of Classification Search ............ 438/786, 438/769, 775, 954, 260, 783, 787; 257/411
   See application file for complete search history.

(56) References Cited

U.S. PATENT DOCUMENTS 5,464,792 A * 11/1995 Tseng et al. ............ 438/585

| 5,512,519 A | 4/1996 | Hwang ................ 437/242 |
| 5,516,707 A | 5/1996 | Loh et al. ............. 437/24 |
| 5,554,871 A | 9/1996 | Yamashita et al. |
| 5,554,876 A | 9/1996 | Kusunoki et al. |
| 5,596,218 A | 1/1997 | Soleimani et al. |
| 5,605,848 A | 2/1997 | Ngaoaram |
| 5,616,519 A | 4/1997 | Ping |
| 5,726,087 A | 3/1998 | Tseng et al. ........... 438/261 |
| 5,731,233 A | 3/1998 | Yamashita et al. |
| 5,747,882 A | 5/1998 | Wang et al. ........... 257/768 |

(Continued)

FOREIGN PATENT DOCUMENTS

JP       63-269536       11/1988

(Continued)

OTHER PUBLICATIONS

Sun et al., "Characterization and Optimization of NO-Nitrided Gate Oxide by RTP", IEEE, 1995, pp. 687-690.*

(Continued)

*Primary Examiner*—Tom Thomas
*Assistant Examiner*—José R. Díaz
(74) *Attorney, Agent, or Firm*—Westerman, Hattori, Daniels & Adrian, LLP

(57) ABSTRACT

A method of fabricating a semiconductor device which includes introducing, after a step of patterning a gate electrode, nitrogen atoms into an oxide film covering a device region on a semiconductor substrate, by exposing said oxide film to an atmosphere containing-nitrogen, such that said nitrogen atoms do not reach a region underneath said gate electrode, covering, after said step of introducing nitrogen atoms, said oxide film including said gate electrode by a CVD oxide film continuously without taking out said semiconductor substrate out of a processing chamber and forming a sidewall oxide film on a sidewall surface of said gate electrode by etching back said CVD oxide film.

3 Claims, 12 Drawing Sheets

U.S. PATENT DOCUMENTS

| | | | |
|---|---|---|---|
| 5,750,435 A * | 5/1998 | Pan | 438/585 |
| 5,773,325 A | 6/1998 | Teramoto | |
| 5,783,469 A | 7/1998 | Gardner et al. | 438/199 |
| 5,786,254 A | 7/1998 | Hao et al. | 438/287 |
| 5,808,348 A | 9/1998 | Ito et al. | |
| 5,834,351 A * | 11/1998 | Chang et al. | 438/266 |
| 5,861,335 A | 1/1999 | Hause et al. | |
| 5,880,040 A | 3/1999 | Sun et al. | 438/769 |
| 5,880,508 A | 3/1999 | Wu | 257/411 |
| 5,923,983 A * | 7/1999 | Fulford et al. | 438/287 |
| 5,936,287 A * | 8/1999 | Gardner et al. | 257/369 |
| 5,955,745 A | 9/1999 | Yamazaki | 257/63 |
| 5,966,606 A * | 10/1999 | Ono | 438/303 |
| 5,972,783 A | 10/1999 | Arai et al. | 438/513 |
| 6,020,231 A | 2/2000 | Wang et al. | |
| 6,110,784 A | 8/2000 | Gardner et al. | 438/287 |
| 6,136,654 A | 10/2000 | Kraft et al. | 438/287 |

FOREIGN PATENT DOCUMENTS

| | | |
|---|---|---|
| JP | 4-010547 | 1/1992 |
| JP | 4-116869 | 4/1992 |
| JP | 4-139882 | 5/1992 |
| JP | 6-204465 | 7/1994 |
| JP | 7-30113 | 1/1995 |
| JP | 070-30113 | 1/1995 |
| JP | 7-226499 | 8/1995 |
| JP | 8-167664 | 6/1996 |
| JP | 9-64362 | 3/1997 |
| JP | 9-129872 | 5/1997 |
| JP | 10-189949 | 7/1998 |

OTHER PUBLICATIONS

Maiti et al. "Oxynitride Gate Dielectric Grown in Nitric Oxide (NO): The Effect of Reoxidation on Dielectric Reliability of the Active Edge", IEEE Electron Device Letters, vol. 17, No. 6, Jun. 1996; pp. 279-281.

Min et al. Impact of Process-Induced Damage on MOSFET Reliability and Suppression of Damage by the use of NO-based Oxynitride Gate Dielectrics, VLSI Technology systems and applications, 1995, Proceedings of Technical papers, 1995, International Symposium pp. 273-276.

Bhat et al. "Performance and Hot-Carrier Reliability of N—and P-MOSFET's with Rapid Thermally NO-nitrided SiO2 Gate Dielectrics", Electron Devices Meeting, 1994, Technical Digest, International 1994, pp. 329-332.

Bhat et al. "Electrical Properties and Reliability of MOSFET's with Rapid Thermal NO-Nitrided SiO2 Gate Dielectrics", Electron Devices, IEEE Transactions on May. 1995, vol. 42, Issue 5, Part I; pp. 907-914.

* cited by examiner

METHOD OF FABRICATING A SEMICONDUCTOR DEVICE CONTAINING NITROGEN IN AN OXIDE FILM

This application is a division of prior application Ser. No. 09/428,052 filed Oct. 27, 1999 which is a division of prior application Ser. No. 08/917,936, filed Aug. 27, 1997, now U.S. Pat. No. 5,990,517.

BACKGROUND OF THE INVENTION

The present invention generally relates to fabrication of semiconductor devices and more particularly to fabrication and construction of a high speed field-effect transistor.

High-speed logic integrated circuits generally use high-speed CMOS circuits. CMOS circuits consume little electric power and are particularly suited for this purpose. In order to increase the operational speed of high-speed CMOS circuits further, a very fast field-effect transistor is needed.

Conventionally, the operational speed of a field-effect transistor has been increased mainly by reducing the gate length, which in turn is achieved by a device miniaturization. For example, MOS transistors having a gate length as small as 0.35 $\mu$m, are used these days for such high performance applications.

On the other hand, further reduction of gate length is generally difficult in MOS transistors, as carriers tend to experience excessive acceleration in a channel region immediately under a gate electrode of the MOS transistor when the gate length of the MOS transistor is thus reduced. The carriers thus accelerated tend to penetrate into a gate oxide film and form fixed electric charges therein, while such fixed electric charges tend to modify the threshold characteristics of the MOS transistor.

In more detail, the carriers thus penetrated into the gate oxide film enter the $SiO_2$ structure that form the gate oxide film, wherein the carriers thus penetrated into the $SiO_2$ structure are held stably when the carriers are captured by the dangling bonds of the $SiO_2$ structure.

Thus, it has been practiced conventionally in the art of MOS transistors to terminate any dangling bonds existing in the gate oxide film by introducing N atoms thereinto, so that the number of the sites which may capture the carriers is reduced as much as possible.

FIGS. 1A–1D show a conventional fabrication process of a MOS transistor.

Referring to FIG. 1A, a field oxide film 2 is formed on a Si substrate 1 doped to the p-type or n-type, such that the field oxide film 2 defines a device region 1A on the surface of the substrate 1. The field oxide film 2 is typically formed by a wet etching process with a thickness of 300–400 nm. Further, a thermal oxide film 3 is formed on the Si substrate 1 so as to cover the device region 1A with a thickness of typically about 6 nm. The thermal oxide film 3 acts as a gate oxide film of the MOS transistor to be formed.

The structure of FIG. 1A is then annealed in an $N_2O$ atmosphere at a temperature of typically 800° C., such that N atoms in the atmosphere are incorporated into the gate oxide film 3.

Next, in the step of FIG. 1B, a polysilicon film 4 is deposited on the structure of FIG. 1A by a CVD process conducted at a temperature of 800–900° C., typically with a thickness of about 150 nm. Further, the polysilicon film 4 is patterned in the step of FIG. 1C by an anisotropic etching process such as an RIE (reactive ion etching) process, and a gate electrode 4A is formed as a result.

After the gate electrode 4A is thus formed, an ion implantation process of a p-type dopant such as B or an n-type dopant such as As or P is introduced into the substrate 1 while using the gate electrode 4A as a mask. Thereby, diffusion regions 1B and 1C are formed in the substrate 1 respectively in correspondence to a source region and a drain region of the MOS transistor to be formed. Further, a CVD-$SiO_2$ film 5 is deposited on the structure thus obtained by a CVD process conducted at the temperature of 800–900° C., typically with a thickness of about 100 nm.

Next, in the step of FIG. 1D, the CVD-$SiO_2$ film 5 is subjected to an anisotropic etching process that acts substantially vertically to the principal surface of the substrate 1, and side wall oxides 5A and 5B are formed at respective lateral sides of the gate electrode 4A. Further, by carrying out the ion implantation process of the p-type dopant or the n-type dopant once more into the substrate 1 in the state that the gate electrode 4A carries the side wall oxides 5A and 5B, further diffusion regions 1B' and 1C' having a higher dopant level are formed inside the diffusion regions 1B and 1C. In other words, the MOS transistor thus formed has a so-called LDD (lightly doped drain) structure.

It should be noted that, in the MOS transistor of the foregoing structure, the gate oxide film 3 acts as an etching stopper when patterning the gate electrode 4A. Thereby, the part of the gate oxide film 3 not protected by the gate electrode 4A may experience an increased degree of damage during the etching process. For example, the Si—O bonds in the $SiO_2$ structure of the gate oxide film 3 may be broken.

When such breaking of the Si—O bond occurs, dangling bonds are formed inevitably in the structure of the gate oxide film 3, while it is known that the dangling bonds tend to capture H or OH ions. In the case of the high speed MOS transistor of FIG. 1D that has a short channel length, there is a substantial risk that the dangling bonds in the gate oxide film 3 capture the hot carriers that are accelerated at the edge of drain region 1C and penetrated into the gate oxide film 3 as indicated in FIG. 2, wherein FIG. 2 shows the drain region 1C in an enlarged scale.

In order to overcome the problem, it has been proposed to introduce N atoms into the gate oxide film 3 in the process of FIG. 1A, such that the N atoms thus introduced terminate the dangling bonds in the gate oxide film 3. As a result of such a process, the trapping of the hot electrons by the dangling bonds is reduced substantially.

On the other hand, the conventional process of FIGS. 1A–1D raises a problem in that, because the N atoms are introduced at a relatively early phase of the process, the N atoms thus incorporated easily escape in the following processes, particularly those including thermal annealing processes. In other words, it has been necessary in the conventional process of FIGS. 1A–1D to incorporate a very large amount of N atoms into the gate oxide film 3 in order that such a doping by the N atoms is effective for suppressing the trapping of the hot carriers by the dangling bonds.

When the N atoms are introduced in the step of FIG. 1A, it should be noted that the N atoms are introduced not only into the part of the gate oxide film 3 corresponding to the edge part of the drain region as shown in FIG. 2 but also into the part immediately underneath the gate electrode 4A. Thereby, the MOS transistor thus obtained tends to show a threshold characteristic substantially different from the desired or designed threshold characteristic.

FIGS. 3A and 3B show a flat-band voltage $V_{FB}$ and a threshold voltage $V_{TH}$ of the MOS transistor for the case in which the gate oxide film, formed as a result of a thermal oxidation process in a dry $O_2$ environment, is exposed to various N-containing atmospheres at a temperature of about 800° C.

Referring to FIGS. 3A and 3B, it will be noted that both the $V_{FB}$ and the $V_{TH}$ are modified significantly as a result of the thermal annealing process conducted in the NO or $N_2O$ atmospheres for various durations. As already noted, the concentration of the N atoms in the gate oxide film 3 is changed substantially by the heating processes included in the steps of FIGS. 1A–1D. Thus, it has been difficult in the conventional MOS transistor, fabricated according to the process of FIGS. 1A–1D, to control the characteristics thereof exactly, and there has been a problem in that the transistor shows a large scattering of the characteristics. This problem becomes particularly acute in the MOS transistors in which a very large amount of N atoms are introduced into the gate oxide film for effective termination of the dangling bonds therein.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device and a fabrication process thereof, wherein the problem of trapping of the hot carriers in the gate oxide film is successfully eliminated while simultaneously realizing a stable and reproducible device characteristic.

Another object of the present invention is to provide a semiconductor device, comprising:
  a substrate;
  a gate oxide film formed on said substrate;
  a gate electrode provided on said gate oxide film;
  first and second diffusion regions formed in said substrate at both lateral sides of said gate electrode;
  said gate electrode including a first region located immediately underneath said gate electrode and a second region adjacent to said first region, said first and second regions containing N atoms with respective concentrations such that said second region contains N with a higher concentration as compared with said first region.

According to the present invention, the variation of the threshold or other characteristic of the semiconductor device is successfully suppressed while simultaneously suppressing the problem of the trapping of the hot carriers in the gate oxide film in the vicinity of the drain edge.

Another object of the present invention is to provide a method of fabricating a semiconductor device, comprising the steps of:
  forming a gate oxide film on a substrate;
  forming a gate electrode pattern on said gate oxide film; and
  introducing N atoms into said gate oxide film while using said gate electrode pattern as a mask.

According to the present invention, the N atoms are introduced into the gate oxide film selectively in correspondence to the edge part of the drain region where the acceleration of the carriers, and hence the formation of the hot carriers, is maximum, while the gate oxide film immediately underneath the gate electrode pattern is maintained substantially free form the N atoms. Thereby, the problem of trapping of the hot carriers in the gate oxide film is successfully avoided in the part where the creation of the hot carriers is maximum. As the gate oxide film is substantially free from the N atoms in the part immediately underneath the gate electrode pattern, the designed operational characteristic is obtained for the semiconductor device with reliability and reproducibility.

Other objects and further features of the present invention will become apparent from the following detailed description when read in conjunction with the attached drawings.

DETAILED DESCRIPTION OF THE PREFERRED EMBODIMENTS

[Principle]

Figure 4:
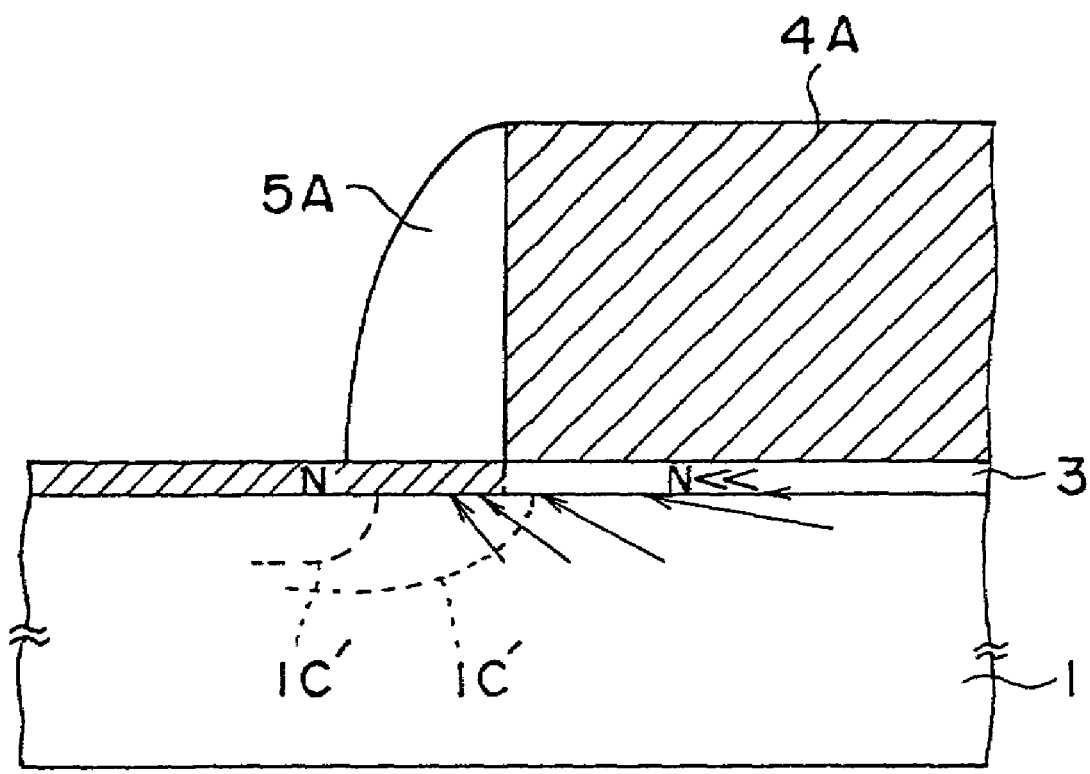
FIG. 4 is a diagram showing the principle of the present invention.

FIG. 4 shows the principle of the present invention, wherein those parts corresponding to the parts described previously are designated by the same reference numerals and the description thereof will be omitted.

Referring to FIG. 4, the present invention introduces N atoms into a part of the gate oxide film 3 indicated by a hatched region selectively with respect to the adjacent region located immediately underneath the gate electrode pattern 4A. Thereby, it should be noted that the N atoms are contained mostly in the hatched region and the concentration of the N atoms in the adjacent region is held minimum. Thus, the problem of modification of the threshold characteristics of the semiconductor device by the N atoms thus doped into the gate oxide film 3 is effectively and successfully minimized.

In the construction of FIG. 4, it should be noted that the N atoms are introduced selectively and with a high concentration level into the region that tends to experience most severe damages during the patterning process of the gate electrode pattern 4A. Further, the region of the gate oxide film 3 where the N atoms are introduced selectively corresponds to the part of the channel region where the creation of the hot carriers is maximum. Thus, any dangling bonds that are created as a result of the damage are immediately terminated by the N atoms and the problem of trapping of the hot carriers by the dangling bonds is successfully eliminated.

As the foregoing doping of the N atoms into the gate oxide film 3 is achieved after the deposition and patterning of the gate electrode pattern 4A, the problem of escaping of the N atoms by the heat caused during the deposition of the gate electrode pattern 4A is successfully avoided.

Further, when the doping of the N atoms is conducted by exposing the gate oxide film 3 to the NO atmosphere, the subsequent process of depositing the side wall oxides 5A and 5B may be conducted immediately thereafter, in the same deposition apparatus, continuously and without exposing the substrate to the environment. It should be noted that the annealing process for introducing the N atoms is conducted at the temperature of about 800° C., while this temperature is the temperature used for depositing the side wall oxides 5A and 5B by way of a CVD process.

[First Embodiment]

FIGS. 5A–5G show the fabrication process of a MOS transistor according to a first embodiment of the present invention.

Figure 1A:
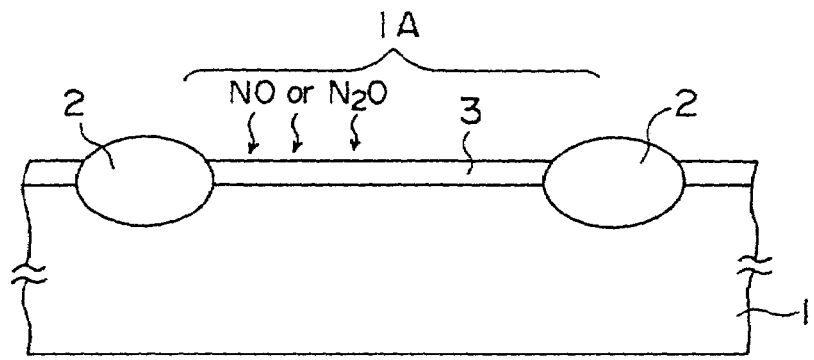
FIGS. 1A–1D are diagrams showing a conventional fabrication process of a semiconductor device.
Figure 5A:
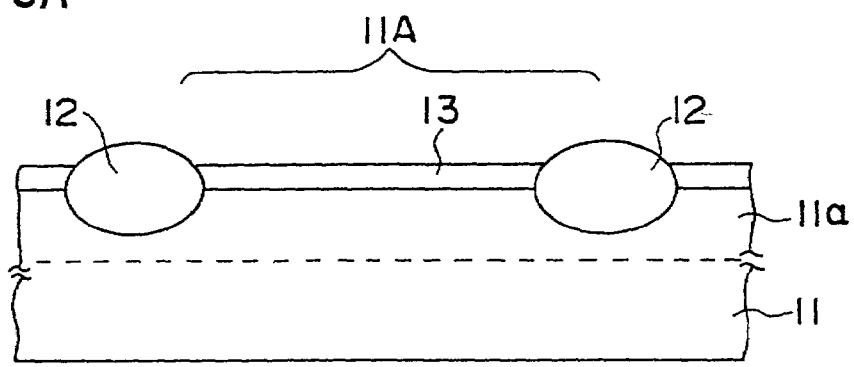
FIGS. 5A–5G are diagrams showing a fabrication process of a semiconductor device according to a first embodiment of the present invention.

Referring to FIG. 5A, a Si substrate 11 corresponding to the Si substrate 1 of FIG. 1A is formed with a well 11a of the p-type or n-type, and a field oxide film 12 is formed on the substrate 11 by a wet oxidation process with a thickness of typically 300–400 nm, such that the field oxide film 12 defines a device region 11A on the surface of the substrate 11. Further, a thermal oxide film 13 is formed on the substrate 11 so as to cover the device region 11A with a thickness of typically 6 nm.

Figure 1B:
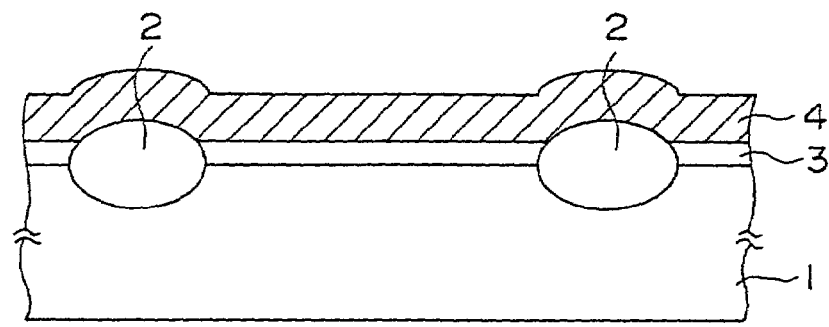
Figure 1C:
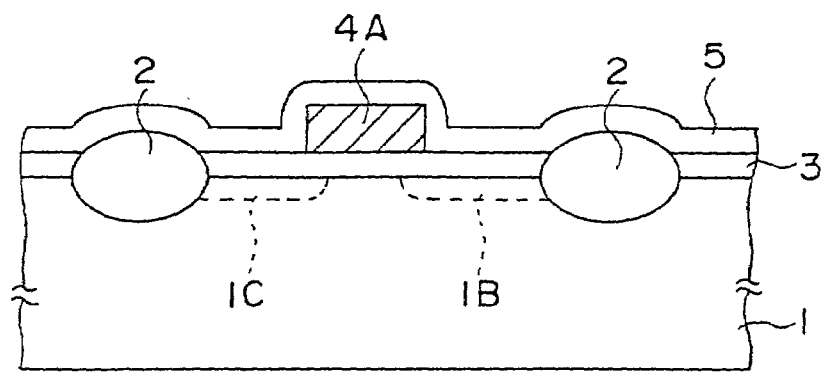
Figure 5B:
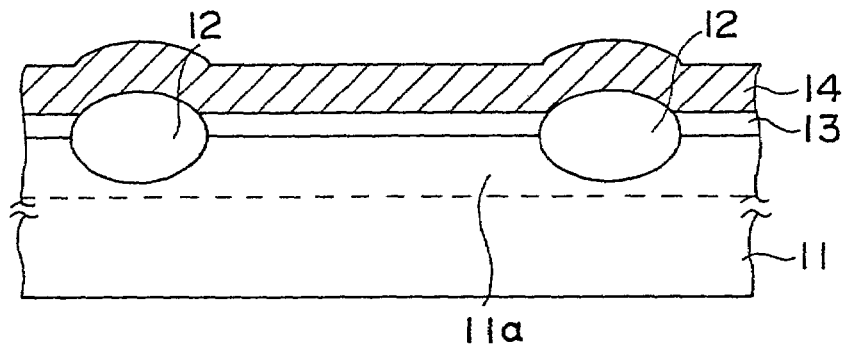

Further, in the step of FIG. 5B, a polysilicon film 14 corresponding to the polysilicon film 4 of FIG. 1B is deposited on the structure of FIG. 5A typically with a thickness of about 15 nm by a CVD process conducted at a temperature of 800–900° C. The polysilicon film 14 thus formed is then subjected to an anisotropic etching process such as an RIE process in the step of FIG. 5C and a gate electrode 14A is formed.

Figure 5C:
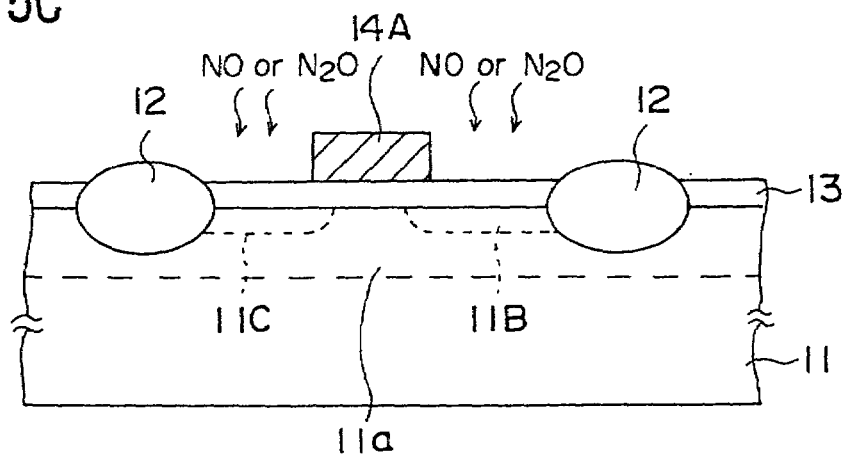

In the step of FIG. 5C, a p-type dopant such as B or an n-type dopant such as As or P is further introduced into the substrate 11 by an ion implantation process while using the gate electrode 14A as a mask, and diffusion regions 11B and 11C are formed in the substrate 11.

Further, the substrate 11 thus processed is introduced into a CVD apparatus and exposed to an atmosphere containing No for a duration of typically 5–20 minutes. Because of the toxic nature of NO, it is preferable to use a diluted gas of NO for the foregoing exposure process in which NO is diluted in an Ar carrier gas with a volumetric concentration of about 30%. Further, it is desirable, for the sake of safety, to carry out the exposure under a reduced pressure environment of about 40 Pa, for example.

As a result of the thermal annealing applied during the exposure process, the impurity elements introduced previously by the ion implantation process cause a diffusion into the substrate 11 and the diffusion regions 11B and 11C noted previously are formed as a result of such a diffusion of the impurity element. Thus, the annealing process associated with an ion implantation process is achieved simultaneously to the thermal annealing process for introducing the N atoms in the present embodiment.

Figure 5D:
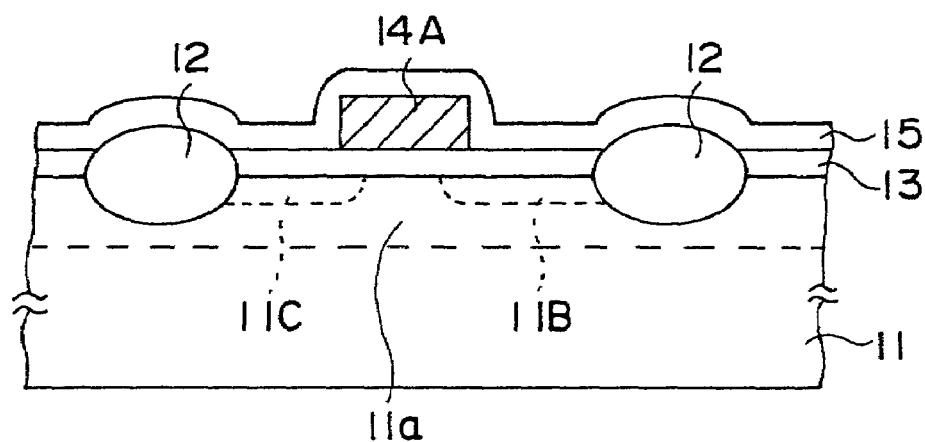

Next, in the step of FIG. 5D, a CVD-SiO$_2$ film 15 is deposited on the structure of FIG. 5C by a CVD process conducted in the same CVD apparatus at a temperature of typically about 800° C., with a thickness of about 100 nm. It should be noted that the CVD process of FIG. 5D is conducted continuously to the exposure process of FIG. 5C.

Figure 1D:
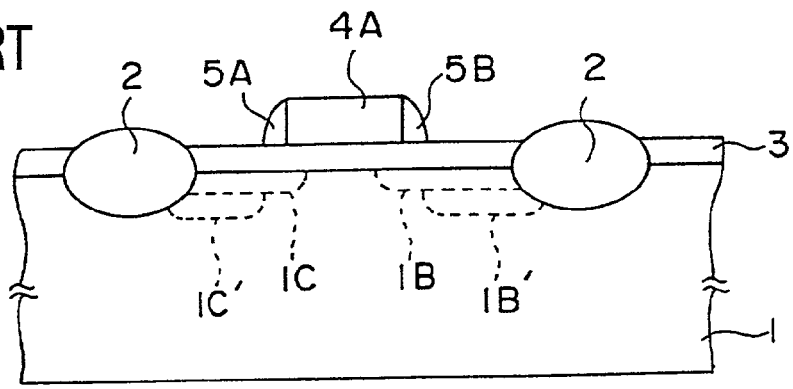
Figure 2:
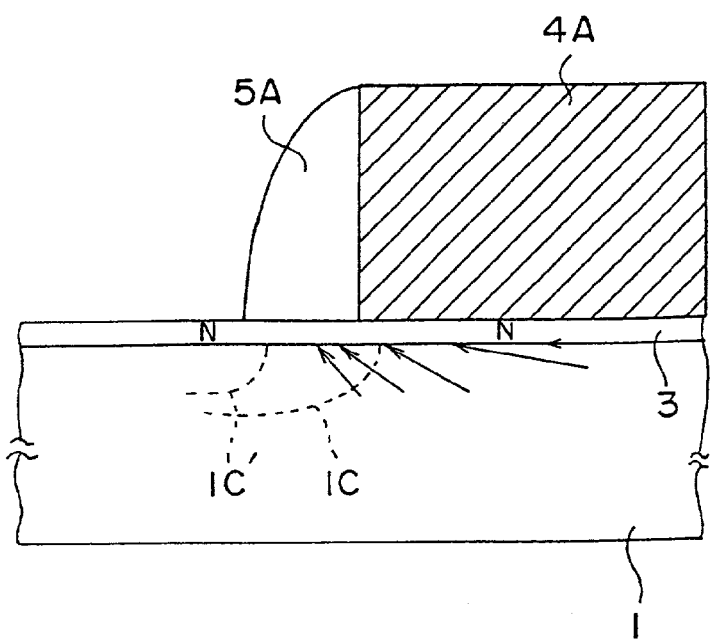
FIG. 2 is a diagram explaining the problem pertinent to the conventional semiconductor device.
Figure 3A:
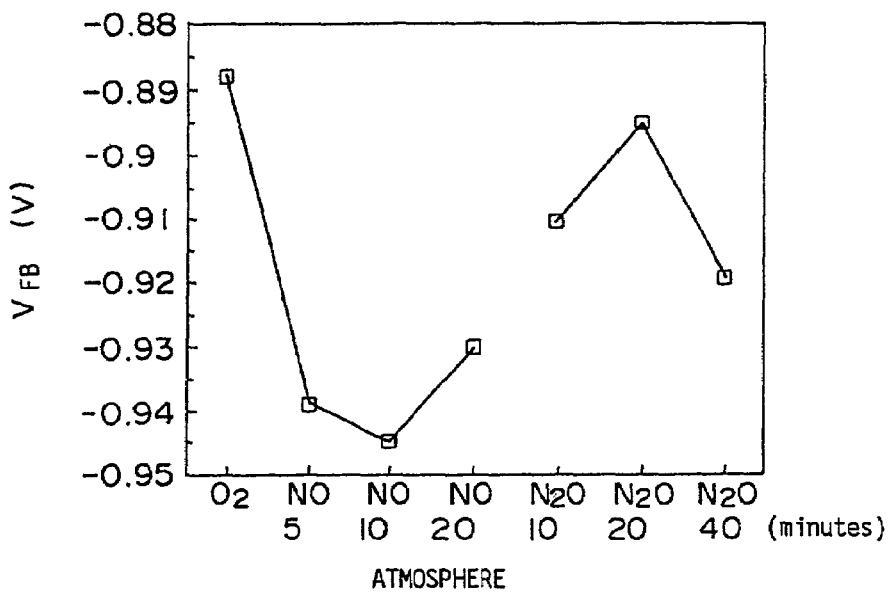
FIGS. 3A and 3B are further diagrams explaining the problem of the conventional semiconductor device.
Figure 3B:
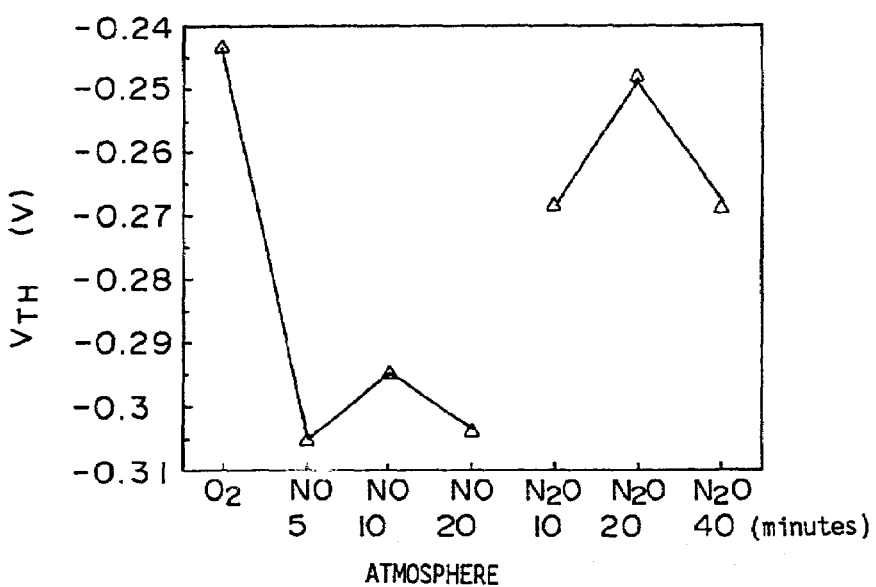
Figure 5E:
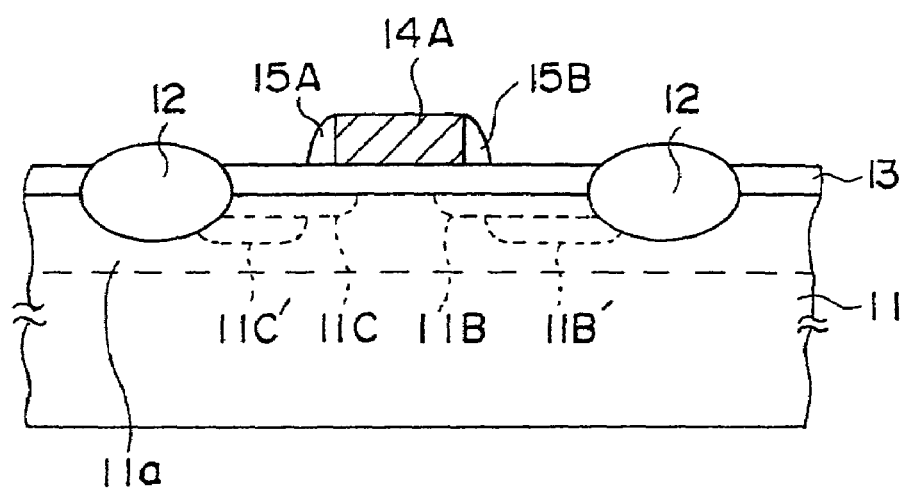

Next, in the step of FIG. 5E, the CVD-SiO$_2$ film 15 is subjected to an anisotropic etching process such as an RIE process acting substantially perpendicularly to the principal surface of the substrate 11, and side wall oxides 15A and 15B are formed at both lateral sides of the gate electrode 14A, similarly to the side wall oxides 5A and 5B of FIG. 1D.

Further, by conducting an ion implantation process of the foregoing p-type or n-type dopant into the substrate 11 in the state that the gate electrode 14A carry the side wall oxides 15A and 15B, an LDD structure including diffusion regions 11B' and 11C' having a higher impurity concentration level inside the diffusion regions 11B and 11C, are obtained.

Figure 5F:
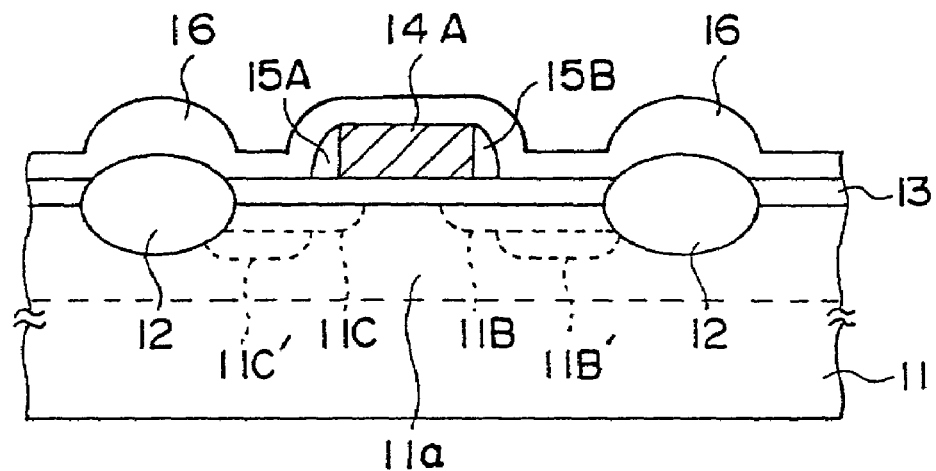

Next, in the step of FIG. 5F, an interlayer insulation film 16 of SiO$_2$ is deposited on the structure of FIG. 5E with an appropriate thickness, and ohmic electrodes 17A and 17B are provided on the interlayer insulation film 16 in ohmic contact with the diffusion regions 11C and 11B respectively via contact holes formed in the interlayer insulation film 16.

In the present embodiment, the process of FIG. 5C for introducing the N atoms into the gate oxide film 13 is carried out while using the gate electrode 14A as a mask. Thus, the incorporation of the N atoms does not occur in the part of the gate oxide film 13 located immediately underneath the gate electrode 14A and covering the channel region. Thus, no substantial change occurs in the threshold characteristic or flat-band characteristic of the MOS transistor even when the N atoms are introduced into the gate oxide film 13.

As the N atoms are introduced with a high concentration level selectively into the part of the gate oxide film 13 corresponding to the drain edge where the creation of the hot-carriers is most prominent, the dangling bonds in the SiO$_2$ structure forming the gate oxide film 13 are effectively terminated, and the sites for trapping hot-carriers are annihilated. Thus, the problem of trapping of the electrons or holes by the gate oxide film 13 is successfully avoided.

In the step of FIG. 5C, it should be noted that the exposure process may be conducted in an atmosphere containing N$_2$O in place of NO. In this case, it is preferable to use the annealing temperature of about 900° C., rather than 800° C. Generally, the amount of the N atoms incorporated into the gate oxide film 13 is reduced when the exposure is carried out in the N$_2$O atmosphere rather than in the No atmosphere. When N$_2$O is used in the step of FIG. 5C, it is necessary to lower the temperature of the CVD apparatus to about 800° C. when carrying out the CVD process of FIG. 5D. Such thermal annealing processes at different temperatures can be conducted efficiently by using a cluster-type processing apparatus.

Figure 6:
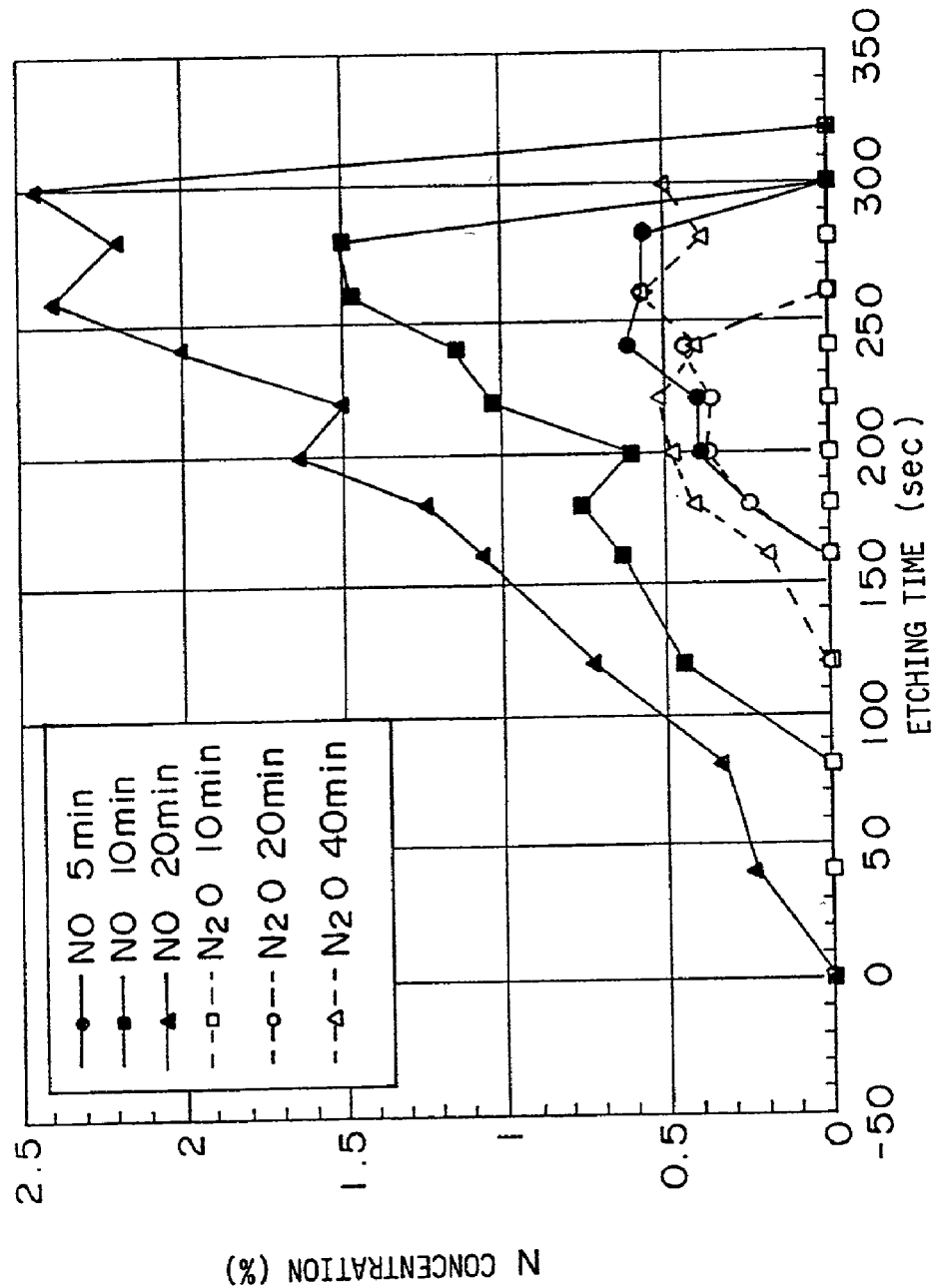
FIG. 6 is a diagram showing a distribution profile of N atoms in a gate oxide film of the semiconductor device of the first embodiment.

FIG. 6 shows the distribution profile of N atoms in the depth direction of the gate oxide film 13 as measured by a SIMS (secondary ion mass spectroscopy) analysis.

Referring to FIG. 6, it should be noted that the concentration level of the N atoms is much higher when the thermal annealing process is conducted in the NO atmosphere rather than the case in which the thermal annealing process is conducted in the N$_2$O atmosphere. Further, FIG. 6 indicates that the N atoms thus introduced are primarily concentrated in the vicinity of the interface between the gate oxide film 13 and the substrate 11. In other words, the N atoms introduced in the step of FIG. 5C into the gate oxide film 13 tend to show a concentration to the interface to the substrate 11. It will be noted that the peak concentration level of the N atoms in the gate oxide film 13 is in the range of about 0.5% to about 2% or more.

In the present embodiment, the thermal annealing process of FIG. 5C in the NO or N$_2$O atmosphere is carried out after the ion implantation process for forming the diffusion regions 11B and 11C. This, however, is not a mandatory condition and it is also possible to carry out the thermal annealing process before the ion implantation process. In this case, however, it is necessary to carry out a separate thermal annealing process for activating the introduced impurity elements in the diffusion regions 11B and 11C.

[Second Embodiment]

FIGS. 7A–7G show the fabrication process of a MOS transistor according to a second embodiment of the present invention.

Figure 7A:
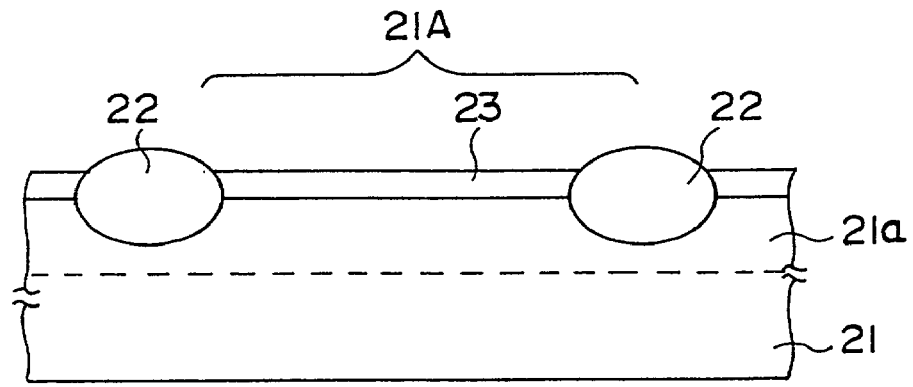
FIGS. 7A–7G are diagrams showing a fabrication process of a semiconductor device according to a second embodiment of the present invention.

Referring to FIG. 7A, a Si substrate 21 corresponding to the Si substrate 1 of FIG. 1A is formed with a well 21a of the p-type or n-type, and a field oxide film 22 is formed on the substrate 21 by a wet oxidation process with a thickness of typically 300–400 nm, such that the field oxide film 22 defines a device region 21A on the surface of the substrate 21. Further, a thermal oxide film 23 is formed on the substrate 21 so as to cover the device region 21A with a thickness of typically 6 nm.

Figure 7B:
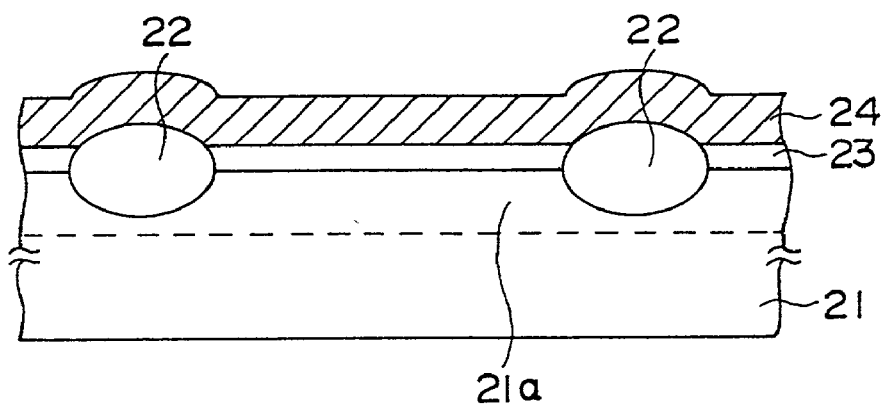

Further, in the step of FIG. 7B, a polysilicon film 24 corresponding to the polysilicon film 4 of FIG. 1B is deposited on the structure of FIG. 7A typically with a thickness of about 15 nm by a CVD process conducted at a temperature of 800–900° C. The polysilicon film 24 thus formed is then subjected to an anisotropic etching process such as an RIE process in the step of FIG. 7C and a gate electrode 24A is formed.

Figure 7C:
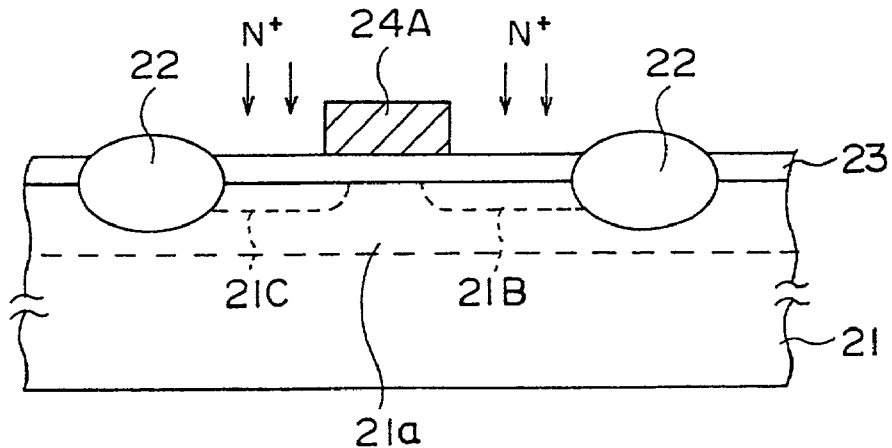

In the step of FIG. 7C, a p-type dopant such as B or an n-type dopant such as As or P is further introduced into the substrate 21 by an ion implantation process while using the gate electrode 24A as a mask, and diffusion regions 21B and 21C are formed in the substrate 21.

In the step of FIG. 7C, the substrate 21 thus processed is subjected to an ion implantation process in which $N^+$ ions are introduced into the gate oxide film 23 while using the gate electrode 24A as a mask. In the ion implantation process of $N^+$ atoms, the acceleration voltage is set such that the $N^+$ atoms do not reach the substrate 21. For example, the acceleration voltage is set to 100 keV or less, and the ion implantation may be made with a dose of $1-3\times10^{14}$ $cm^{-2}$ such that substantially the entire dangling bonds in the film 23 are terminated.

Figure 7D:
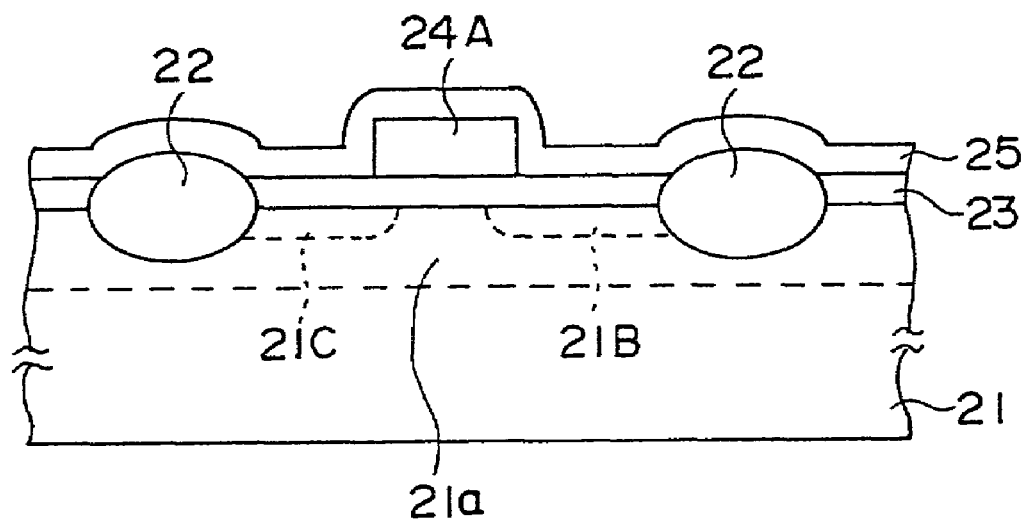

Next, in the step of FIG. 7D, a $CVD-SiO_2$ film 25 is deposited on the structure of FIG. 7C by a CVD process conducted in the same CVD apparatus at a temperature of typically about 800° C., with a thickness of about 100 nm.

Figure 7E:
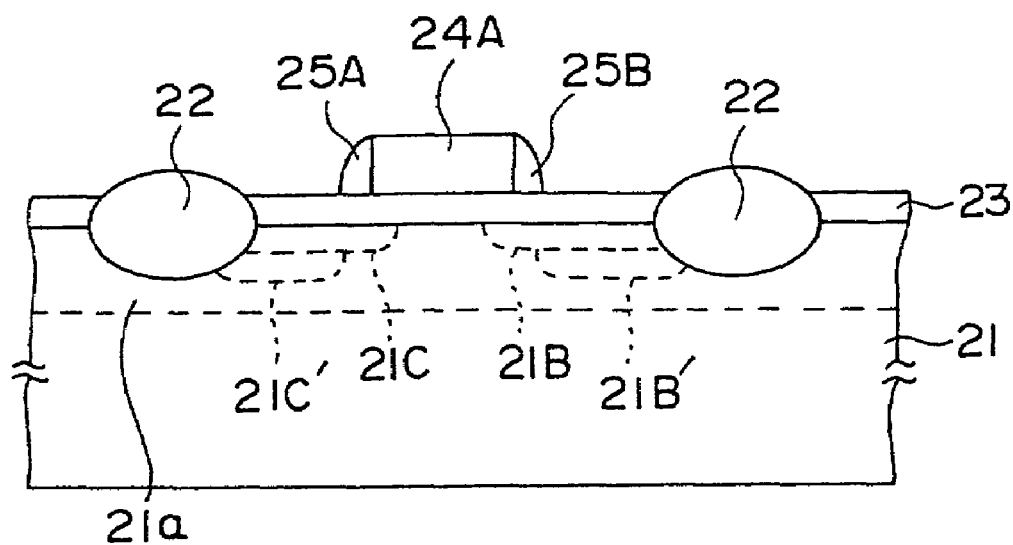

Next, in the step of FIG. 7E, the $CVD-SiO_2$ film 25 is subjected to an anisotropic etching process such as an RIE process acting substantially perpendicularly to the principal surface of the substrate 21, and side wall oxides 25A and 25B are formed at both lateral sides of the gate electrode 24A, similarly to the side wall oxides 5A and 5B of FIG. 1D. Further, by conducting an ion implantation process of the foregoing p-type-or n-type dopant into the substrate 21 in the state that the gate electrode 24A carry the side wall oxides 25A and 25B, an LDD structure including diffusion regions 21B' and 21C' having a higher impurity concentration level inside the diffusion regions 21B and 21C, are obtained.

Figure 7F:
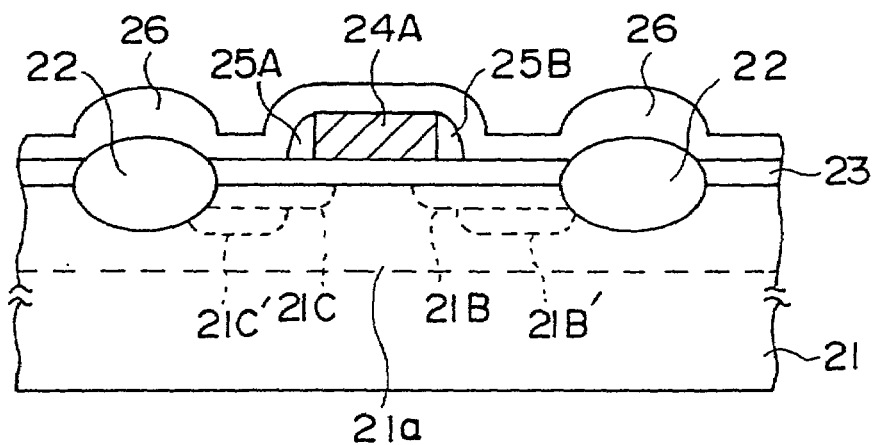
Figure 7G:
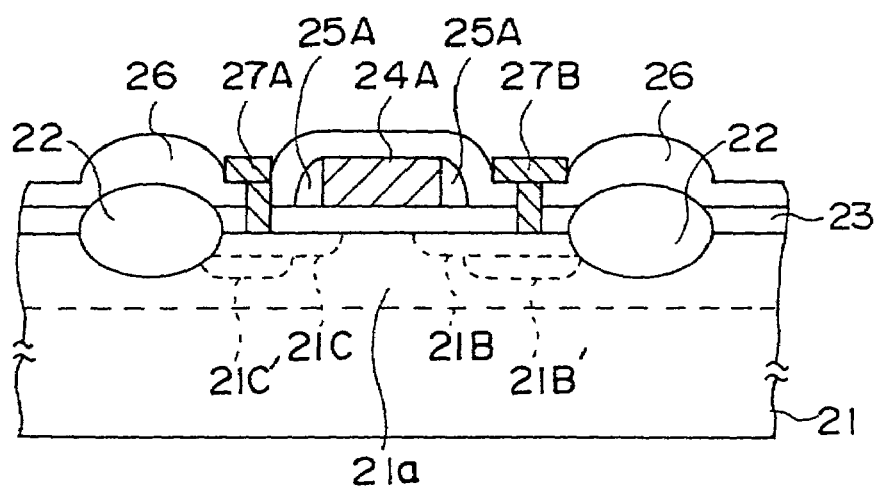

Next, in the step of FIG. 7F, an interlayer insulation film 26 of $SiO_2$ is deposited on the structure of FIG. 7E with an appropriate thickness, and ohmic electrodes 27A and 27B are provided on the interlayer insulation film 26 in ohmic contact with the diffusion regions 21C and 21B respectively via contact holes formed in the interlayer insulation film 26.

In the present embodiment, too, the process of FIG. 7C for introducing the N atoms into the gate oxide film 23 is carried out while using the gate electrode 24A as a mask. Thus, the incorporation of the N atoms does not occur in the part of the gate oxide film 23 located immediately underneath the gate electrode 24A and hence covering the channel region. Thus, no substantial change or modification occurs in the threshold characteristic or flat-band characteristic of the MOS transistor even when the N atoms are introduced into the gate oxide film 23.

As the N atoms are introduced with a high concentration level selectively into the part of the gate oxide film 23 corresponding to the drain edge where the creation of the hot-carriers is most prominent, the dangling bonds in the $SiO_2$ structure forming the gate oxide film 23 are effectively terminated, and the sites for trapping hot-carriers are annihilated. Thus, the problem of trapping of the electrons or holes by the gate oxide film 23 is successfully avoided.

Figure 5G:
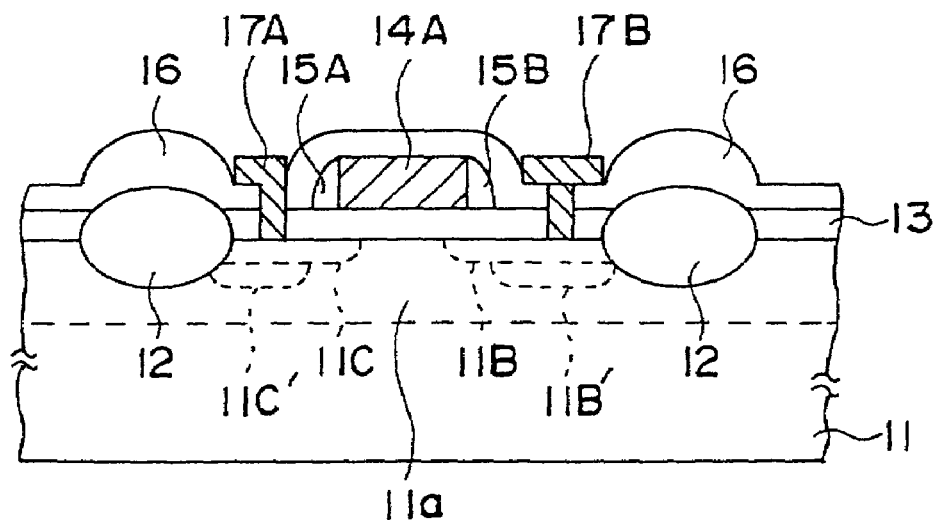
Figure 8:
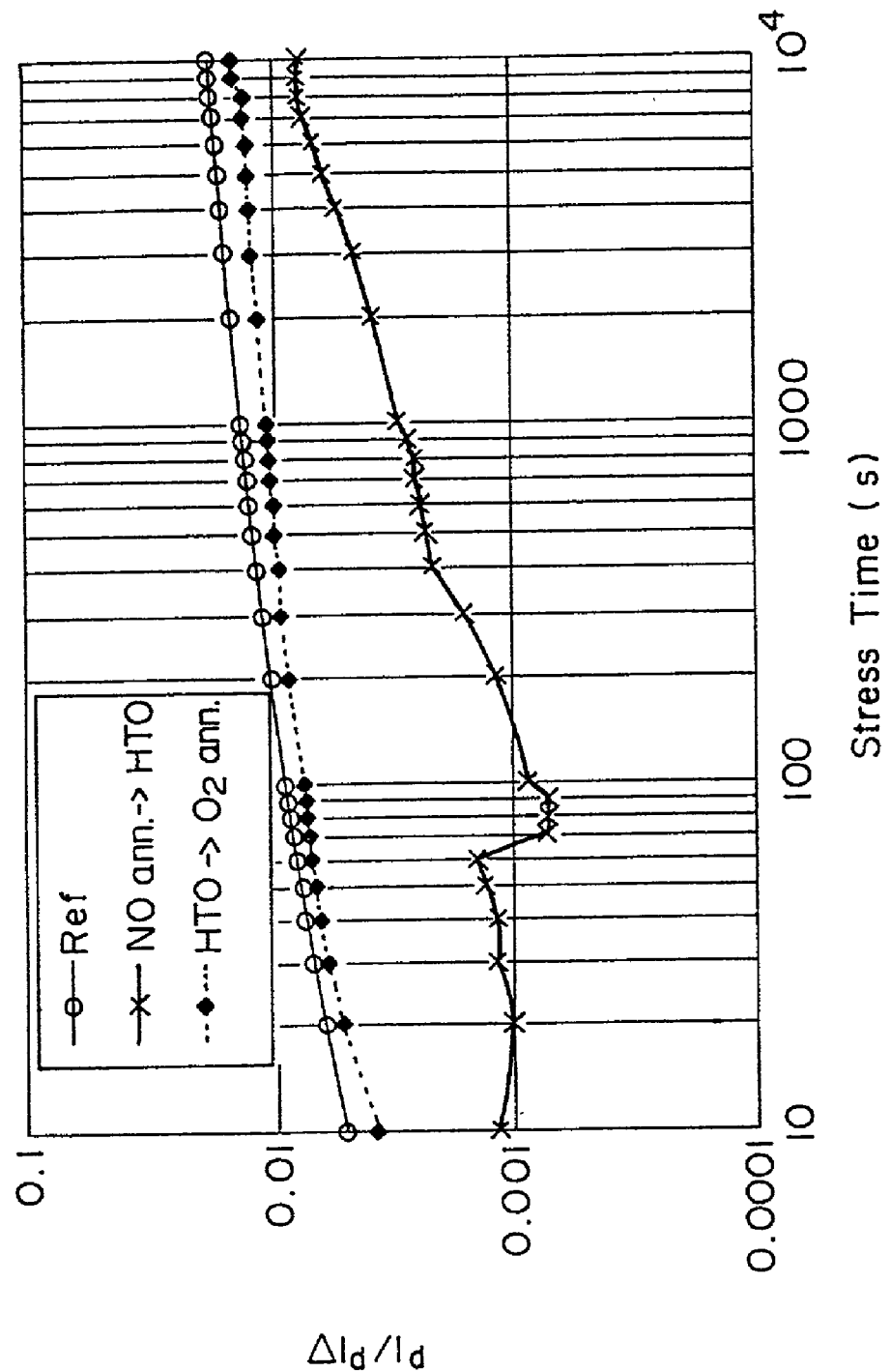
FIG. 8 is a diagram showing the effect of the present invention.

FIG. 8 shows, by a thick continuous line designated by "X," the degradation or variation $\Delta Id$ of a drain current Id with a stress time, for a 64M bit DRAM that uses the MOS transistor of FIG. 5G. Further, FIG. 8 shows also a similar change of the drain current, by open circles and designated as "REF," for the case in which the MOS transistor is formed without incorporation of N atoms into the gate oxide film. Further, FIG. 8 shows by solid circles the change of the drain current Id for the case in which the gate oxide film is annealed in an oxygen atmosphere. In any of the cases, the gate oxide film of the MOS transistor has a thickness of about 10 nm.

Referring to FIG. 8, it should be noted that the variation or degradation of the drain current $\Delta Id$ with time is significantly suppressed by incorporating the N atoms into the gate oxide film excluding the region located immediately underneath the gate electrode.

Further, the present invention is not limited to the embodiments described heretofore, but various variations and modifications may be made without departing from the scope of the invention.

What is claimed is:

1. A method of fabricating a semiconductor device, consisting the steps of:

introducing, after a step of patterning a gate electrode, nitrogen atoms into a gate oxide film covering a device region on a semiconductor substrate, by exposing said gate oxide film to an atmosphere containing nitrogen, such that a concentration of nitrogen decreases in a region of said oxide film covered by said gate electrode and located at a peripheral edge of said gate electrode, as compared with a region of said gate oxide film outside said peripheral edge of said gate electrode;

covering, after said step of introducing nitrogen atoms, said gate oxide film including said gate electrode by a CVD oxide film continuously without taking out said semiconductor substrate out of a processing chamber; and forming a sidewall oxide film on a sidewall surface of said gate electrode by etching back said CVD oxide film, said step of introducing nitrogen atoms being conducted such that said concentration of nitrogen in said gate oxide film changes abruptly at said peripheral edge of said gate electrode, said step of introducing nitrogen atoms being conducted such that said nitrogen atoms cause concentration in said gate oxide film at an interface between said gate oxide film and said semiconductor substrate, wherein said method further comprising the step of forming diffusion regions at both lateral sides of said gate electrode by introducing impurity elements into said semiconductor substrate through said gate oxide film while using said gate electrode as a mask, and wherein said step of introducing impurity elements is conducted prior to said step of introducing N atoms into said gate oxide film.

2. A method as claimed in claim 1, wherein said atmosphere contains NO and said thermal annealing process is conducted at a temperature of about 800° C.

3. A method as claimed in claim 1, wherein said atmosphere contains $N_2O$ and said thermal annealing process is conducted at a temperature of about 900° C.

* * * * *